US009890943B2

(12) United States Patent
Badley

(10) Patent No.: US 9,890,943 B2
(45) **Date of Patent: *Feb. 13, 2018**

(54) THERMALLY DISSIPATED LIGHTING SYSTEM

(71) Applicant: Cooper Technologies Company, Houston, TX (US)

(72) Inventor: Caleb Timothy Badley, Sharpsburg, GA (US)

(73) Assignee: Cooper Technologies Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/595,550

(22) Filed: May 15, 2017

(65) Prior Publication Data

US 2017/0248300 A1 Aug. 31, 2017

Related U.S. Application Data

(63) Continuation of application No. 14/724,339, filed on May 28, 2015, now Pat. No. 9,651,238.

(Continued)

(51) Int. Cl.

| | |
|---|---|
| ***F21V 7/04*** | (2006.01) |
| ***H01L 33/00*** | (2010.01) |
| ***F21V 29/74*** | (2015.01) |
| ***F21V 23/00*** | (2015.01) |
| ***F21V 29/507*** | (2015.01) |

(Continued)

(52) U.S. Cl.

CPC .............. *F21V 29/74* (2015.01); *F21S 8/081* (2013.01); *F21V 23/007* (2013.01); *F21V 29/507* (2015.01); *F21S 8/003* (2013.01); *F21V 7/0091* (2013.01); *F21V 23/008* (2013.01);

(Continued)

(58) Field of Classification Search

CPC ........ F21V 29/74; F21V 29/507; F21V 29/50; F21V 29/70; F21V 23/007; F21V 23/008; F21V 23/009; F21S 8/081; F21S 8/003

See application file for complete search history.

(56) References Cited

U.S. PATENT DOCUMENTS 9,108,261 B1 8/2015 Patrick
2010/0014289 A1 1/2010 Thomas (Continued)

FOREIGN PATENT DOCUMENTS

EP 9419593 2/1995
EP 2711626 3/2014

(Continued)

OTHER PUBLICATIONS

International Search Report for PCT/US2015/032965, dated Sep. 3,2015.

*Primary Examiner* — Alexander Garlen

(74) *Attorney, Agent, or Firm* — King & Spalding LLP

(57) ABSTRACT

A lighting system or luminaire can comprise two environmentally sealed housings. One of the housings can house one or more light emitting diodes. The other housing can house a driver for supplying electricity to the light emitting diode or diodes. The housings can be nested together. For example, one of the housings can extend partially into a cavity of the other housing. A portion of the cavity can remain unfilled when the housings are nested, to provide an air gap between the two housings. The air gap can be environmentally exposed, for example exposed to moisture when the lighting system is mounted outdoors.

19 Claims, 11 Drawing Sheets

Related U.S. Application Data

(60) Provisional application No. 62/006,479, filed on Jun. 2, 2014.

(51) Int. Cl.

| | |
|---|---|
| ***F21S 8/08*** | (2006.01) |
| *F21V 29/50* | (2015.01) |
| *F21S 8/00* | (2006.01) |
| *F21V 7/00* | (2006.01) |
| *F21V 31/00* | (2006.01) |
| *F21V 29/70* | (2015.01) |

(52) U.S. Cl.

CPC ............ *F21V 23/009* (2013.01); *F21V 29/50* (2015.01); *F21V 29/70* (2015.01); *F21V 31/005* (2013.01)

(56) References Cited

U.S. PATENT DOCUMENTS

| | | | |
|---|---|---|---|
| 2010/0177515 | A1 | 7/2010 | Shoushtari |
| 2010/0264826 | A1 | 10/2010 | Yatsuda |
| 2012/0250321 | A1 | 10/2012 | Blincoe |
| 2013/0242574 | A1 | 9/2013 | Guercio et al. |
| 2014/0036504 | A1 | 2/2014 | Kim |
| 2014/0307441 | A1 | 10/2014 | Wu |
| 2014/0355302 | A1 | 12/2014 | Wilcox |

FOREIGN PATENT DOCUMENTS

| | | |
|---|---|---|
| EP | 2775195 | 9/2014 |
| WO | WO 2014/059567 | 4/2014 |

THERMALLY DISSIPATED LIGHTING SYSTEM

CROSS REFERENCE TO RELATED APPLICATIONS

This application claims priority to U.S. Non-Provisional patent application Ser. No. 14/724,339 filed May 28, 2015 in the name of Caleb Timothy Badley and titled "Thermally Dissipated Lighting System," which in turn claims priority to U.S. Provisional Patent Application No. 62/006,479 filed Jun. 2, 2014 in the name of Caleb Timothy Badley and titled "Thermally Dissipated Lighting System". The entire contents of the foregoing applications are hereby incorporated herein by reference.

TECHNICAL FIELD

Embodiments of the technology relate generally to lighting systems, and more particularly to a lighting system that comprises a light emitting diode (LED) and a light emitting diode driver and that is configured to divert light-emitting-diode-generated heat away from the driver.

BACKGROUND

Light emitting diodes (LEDs) offer substantial potential benefit for illumination applications associated with energy efficiency, light quality, and compact size. However, light emitting diodes and the associated drivers that supply electricity to the light emitting diodes can be more sensitive to heat than their incandescent counterparts.

Accordingly, there are needs in the art for technology to manage heat associated with operating light emitting diodes for illumination applications. Need further exits for separately managing the heat generated by operating a light emitting diode and the heat generated by operating a driver that is associated with the light emitting diode. Need further exists for dissipating heat in outdoor lighting systems in which a light emitting diode and an associated driver are housed in one or more environmentally sealed housings. A capability addressing one or more such needs, or some other related deficiency in the art, would support improved illumination systems and more widespread utilization of light emitting diodes in lighting applications.

SUMMARY

A lighting system or luminaire can comprise two environmentally sealed housings for housing at least one light emitting diode and at least one light emitting diode driver. The exterior of one of the housings can be shaped to form a cavity. The exterior of the other housing can be shaped to extend partially into the cavity, for example in a nested arrangement. When the two housing are so arranged, an air gap between the two housings can remain open in the cavity. The air gap can promote heat dissipation.

The foregoing discussion is for illustrative purposes only. Various aspects of the present technology may be more clearly understood and appreciated from a review of the following text and by reference to the associated drawings and the claims that follow. Other aspects, systems, methods, features, advantages, and objects of the present technology will become apparent to one with skill in the art upon examination of the following drawings and text. It is intended that all such aspects, systems, methods, features, advantages, and objects are to be included within this description and covered by this application and by the appended claims of the application.

Figure 1:
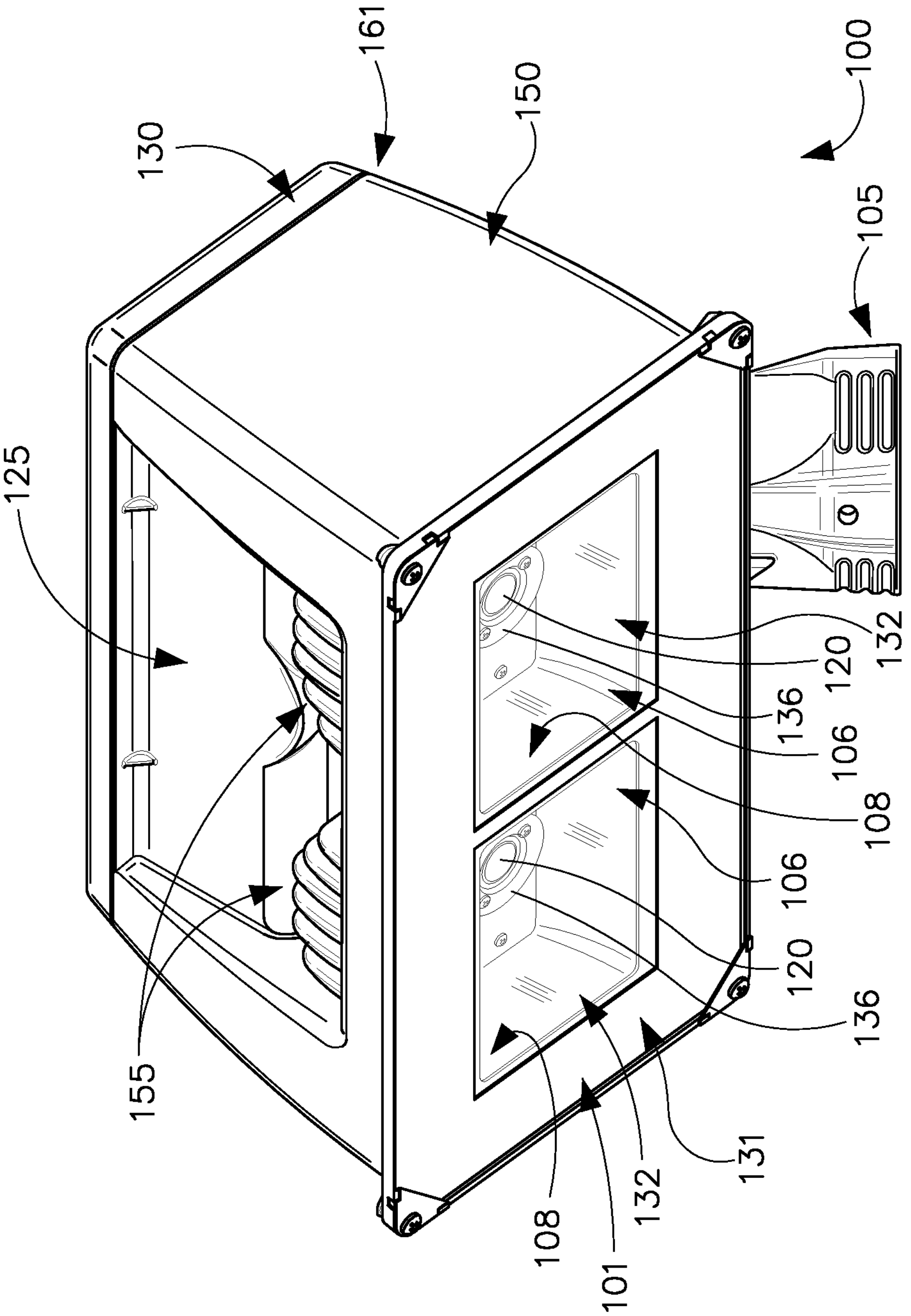
FIG. 1 illustrates an isometric view of a lighting system, from a front perspective, according to some example embodiments of the disclosure.

The drawings illustrate only example embodiments and are therefore not to be considered limiting of the embodiments described, as other equally effective embodiments are within the scope and spirit of this disclosure. The elements and features shown in the drawings are not necessarily drawn to scale, emphasis instead being placed upon clearly illustrating principles of the embodiments. Additionally, certain dimensions or positionings may be exaggerated to help visually convey certain principles. In the drawings, similar reference numerals among different figures designate like or corresponding, but not necessarily identical, elements.

DETAILED DESCRIPTION OF EXAMPLE EMBODIMENTS

A representative lighting system can comprise two housings. An outer surface of one of the housings can be shaped to form a cavity. A portion of the other housing can extend partially into the cavity, for example in a nested arrangement with a gap at the bottom of the cavity. Heat generated during operation of the lighting system can dissipate via the gap.

Some representative embodiments will be described below with example reference to the accompanying drawings that illustrate a representative embodiment of the technology. The technology may, however, be embodied in many different forms and should not be construed as limited to the embodiments set forth herein; rather, these embodiments are provided so that this disclosure will be thorough and complete, and will fully convey the scope of the technology to those appropriately skilled in the art.

The figures illustrate an example embodiment of a lighting system 100 that comprises light emitting diodes 120 and a light emitting diode driver 175 that each generates heat during operation. The illustrated lighting system 100 further comprises technology to divert the light-emitting-diode-generated heat away from the light emitting diode driver 175, thereby extending the life of the light emitting diode driver 175. As illustrated and discussed below, the light emitting diodes 120 are enclosed in a light source housing 150, and the light emitting diode driver 175 is enclosed in a driver housing 125 with an access door 130. In preparation for describing the lighting system 100 in further detail, the figures will now be discussed individually.

Figure 2:
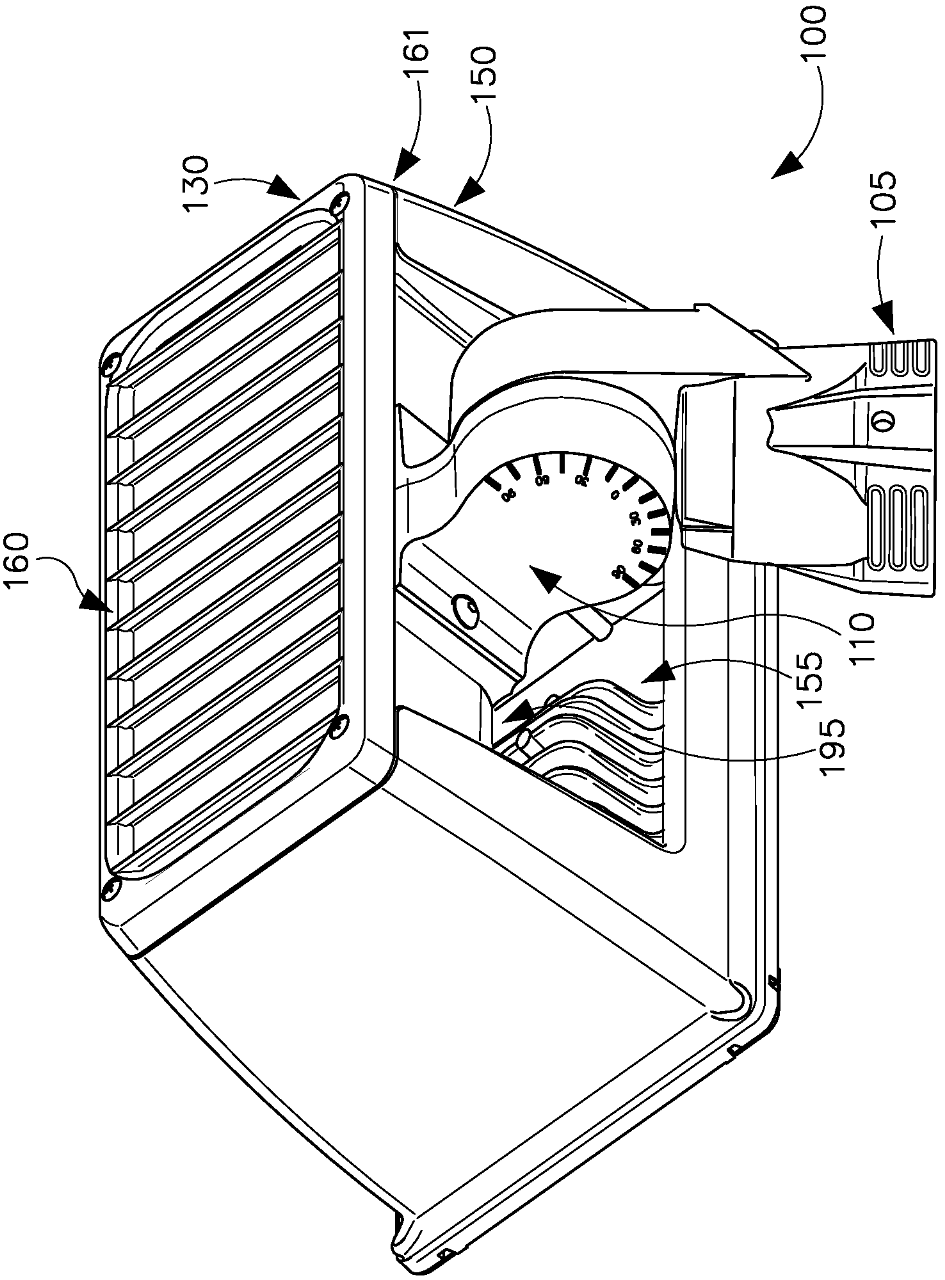
FIG. 2 illustrates an isometric view of the lighting system, from a rear perspective, according to some example embodiments of the disclosure.
Figure 3:
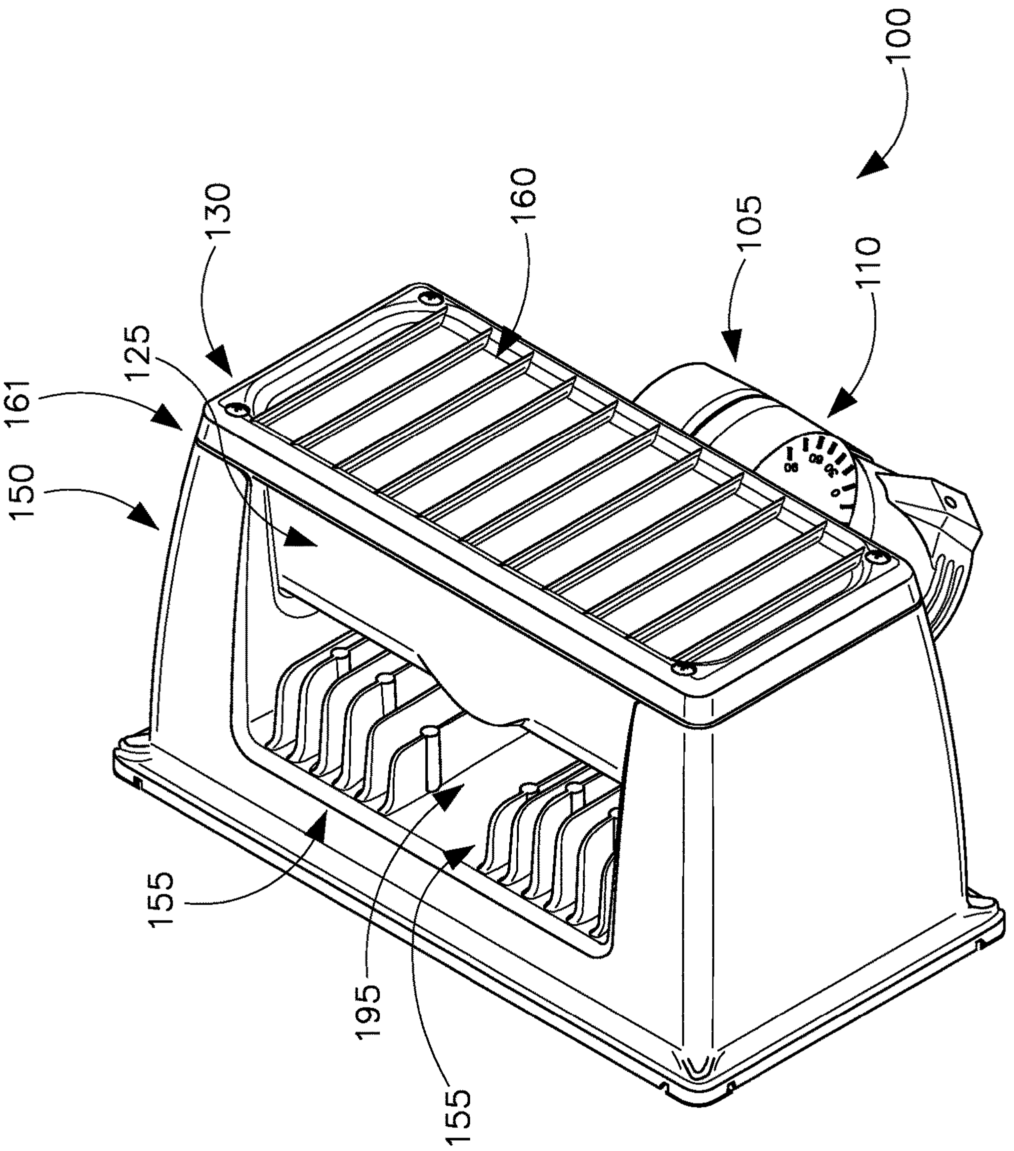
FIG. 3 illustrates an isometric view of the lighting system, from a top perspective, according to some example embodiments of the disclosure.
Figure 4:
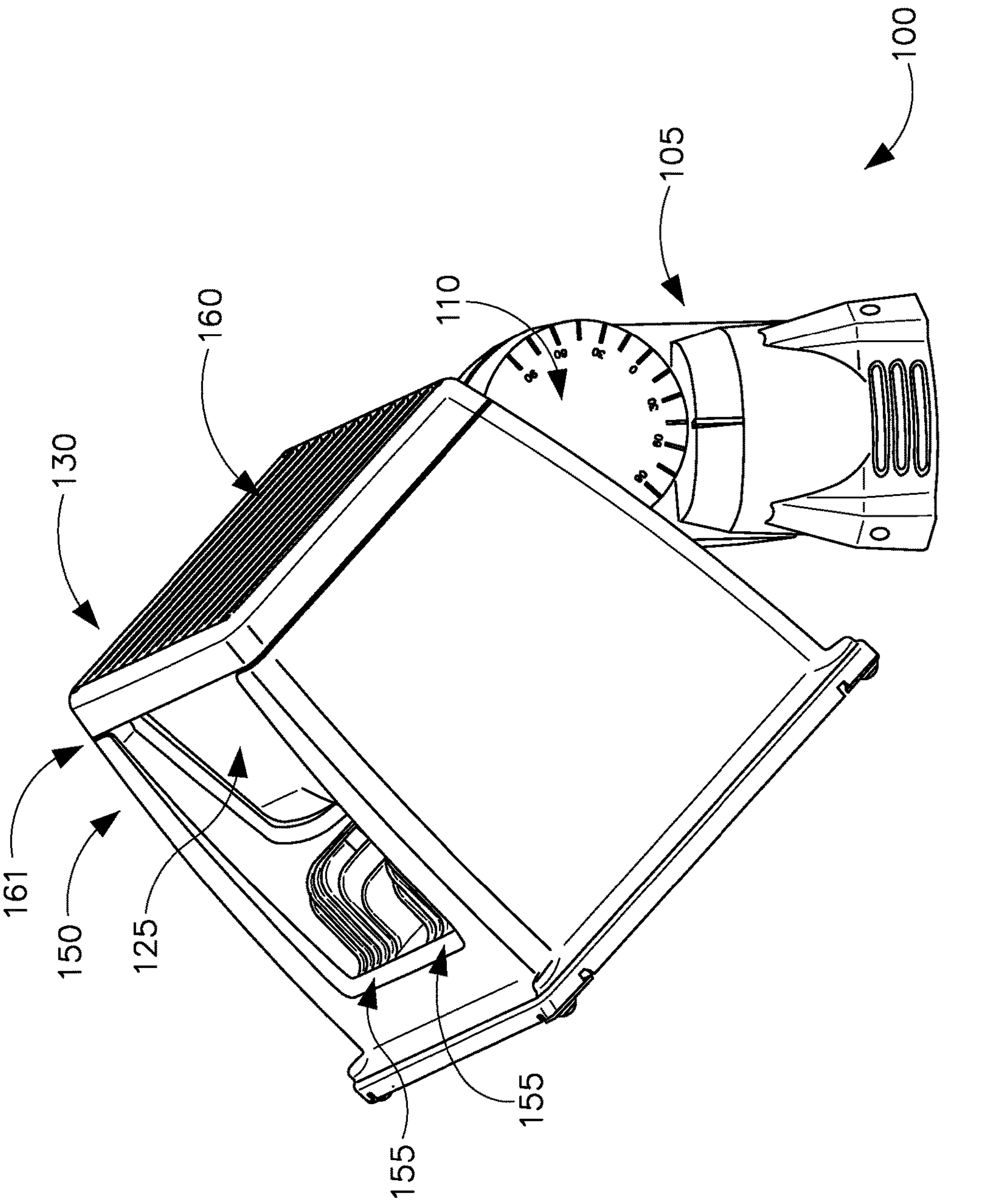
FIG. 4 illustrates an isometric view of the lighting system, from a side perspective, according to some example embodiments of the disclosure.
Figure 5:
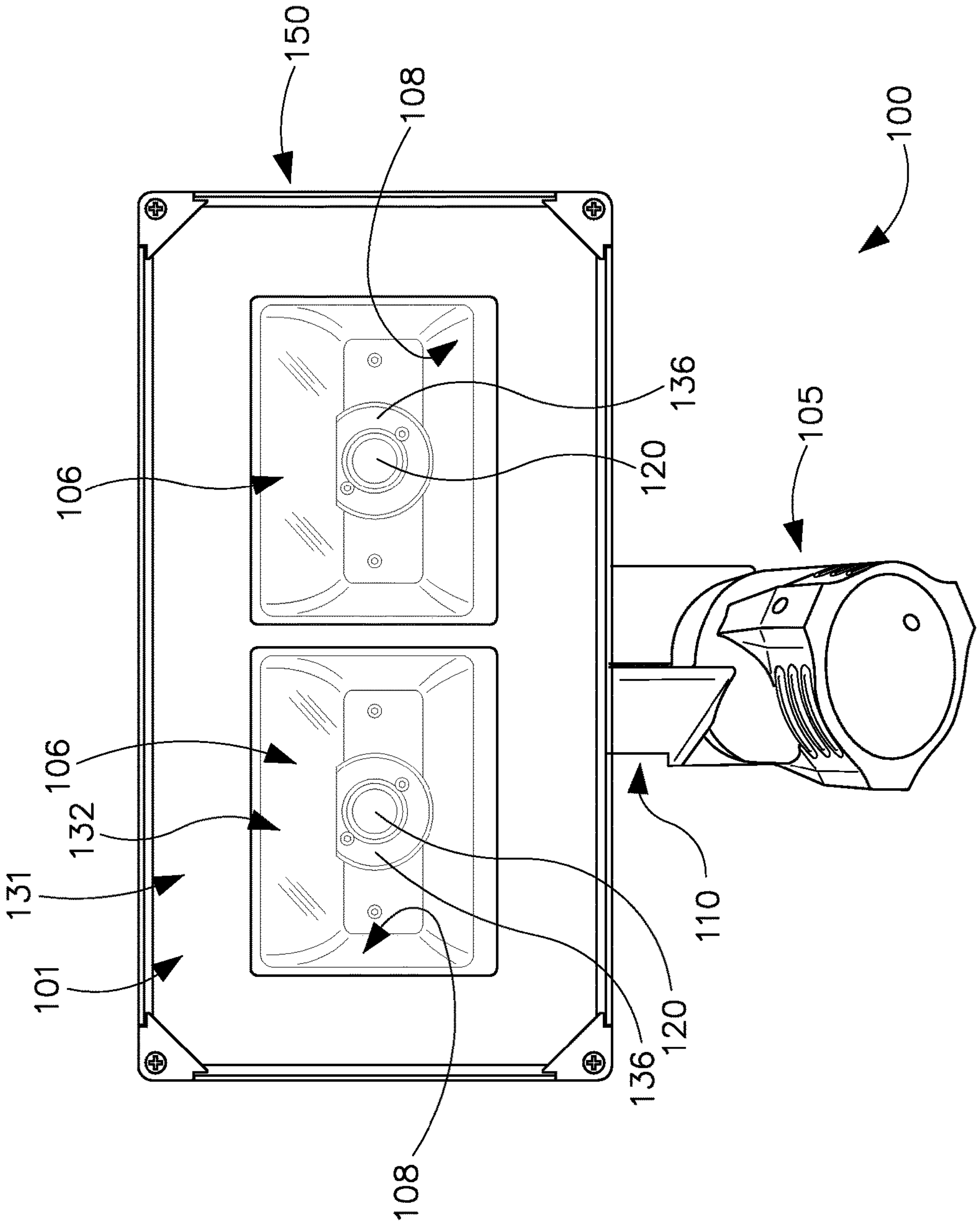
FIG. 5 illustrates the light-emitting side of the lighting system according to some example embodiments of the disclosure.

FIG. 1 illustrates an isometric view of the lighting system 100, from a front perspective. FIG. 2 illustrates an isometric view of the lighting system 100, from a rear perspective. FIG. 3 illustrates an isometric view of the lighting system 100, from a top perspective. FIG. 4 illustrates an isometric view of the lighting system 100, from a side perspective. FIG. 5 illustrates the front or light-emitting side of the lighting system 100.

Figure 6A:
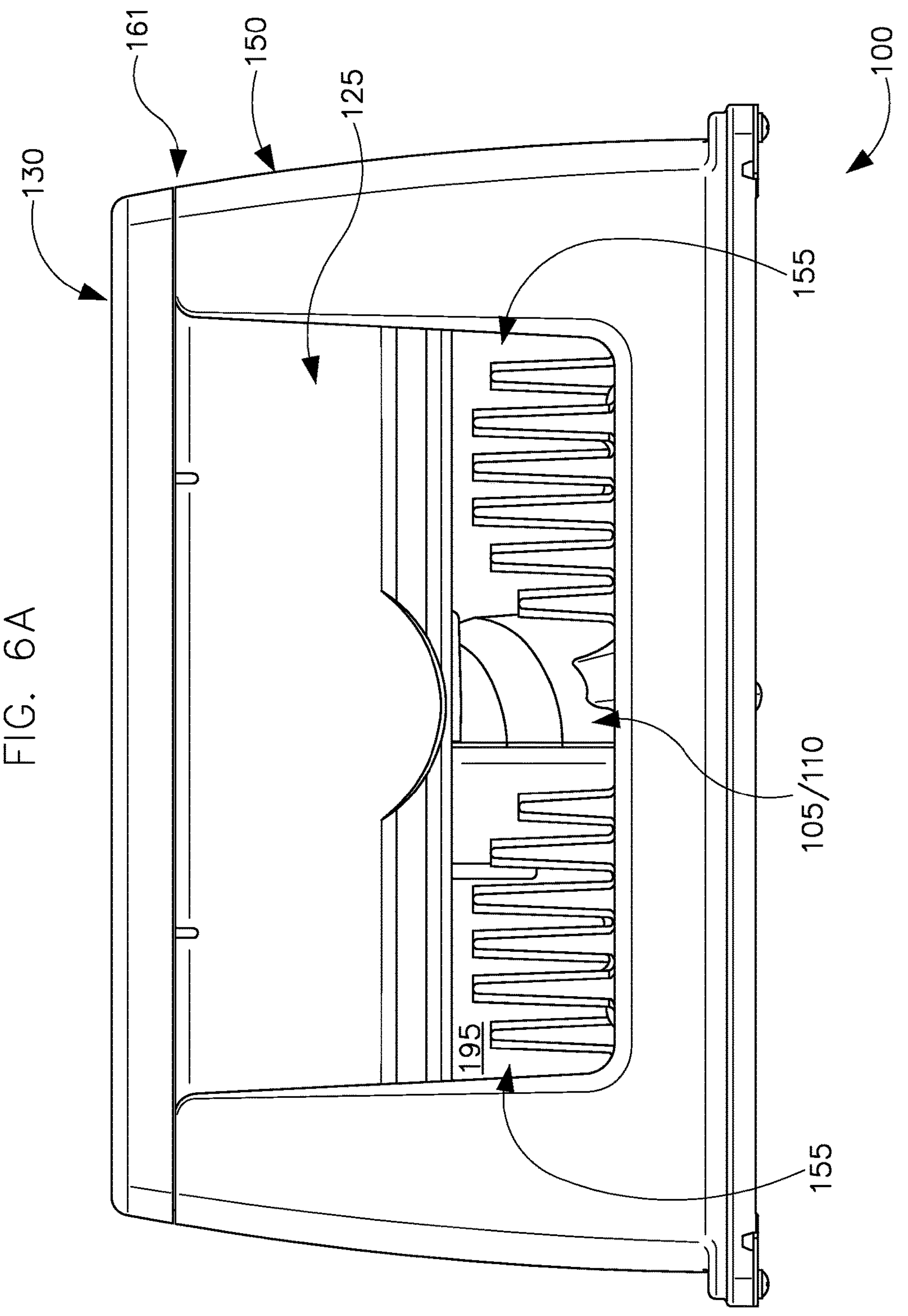
FIGS. 6A and 6B (collectively FIG. 6) illustrate the top of the lighting system according to some example embodiments of the disclosure.
Figure 6B:
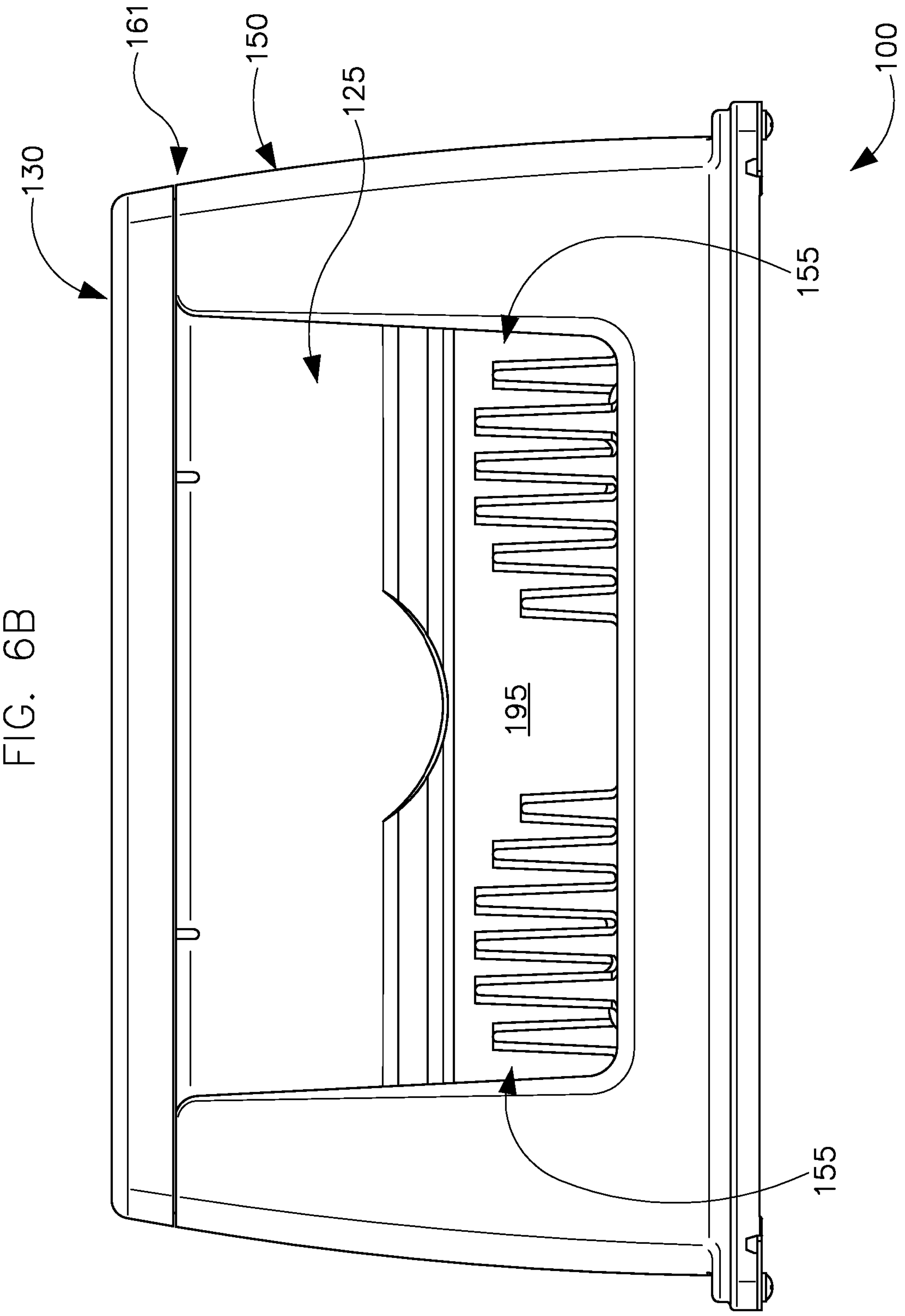

FIGS. 6A and 6B illustrate the top of the lighting system 100. In the view of FIG. 6A, mounting hardware 105/110 of the lighting system 100 is attached. In FIG. 6B, the mounting hardware 105/110 is removed. Thus, FIGS. 6A and 6B illustrate common views, except that the mounting hardware 105/110 is present in FIG. 6A and removed in FIG. 6B.

Figure 7B:
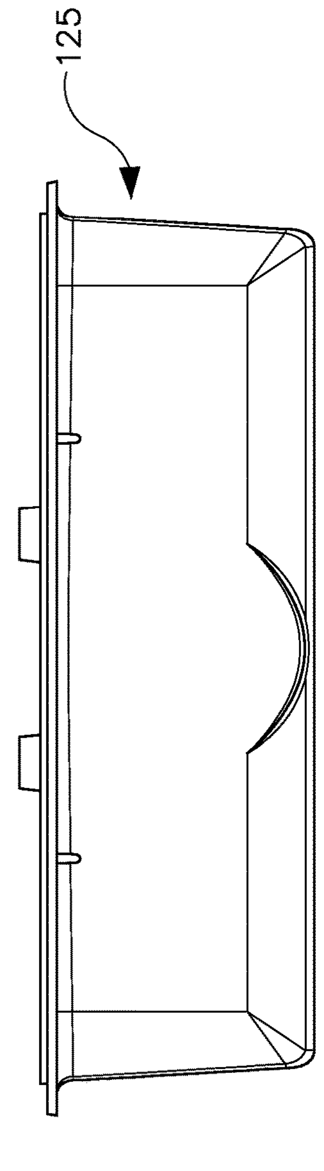
FIGS. 7A and 7B (collectively FIG. 7) illustrate an exploded view of the lighting system, without mounting hardware, according to some example embodiments of the disclosure.
Figure 7A:
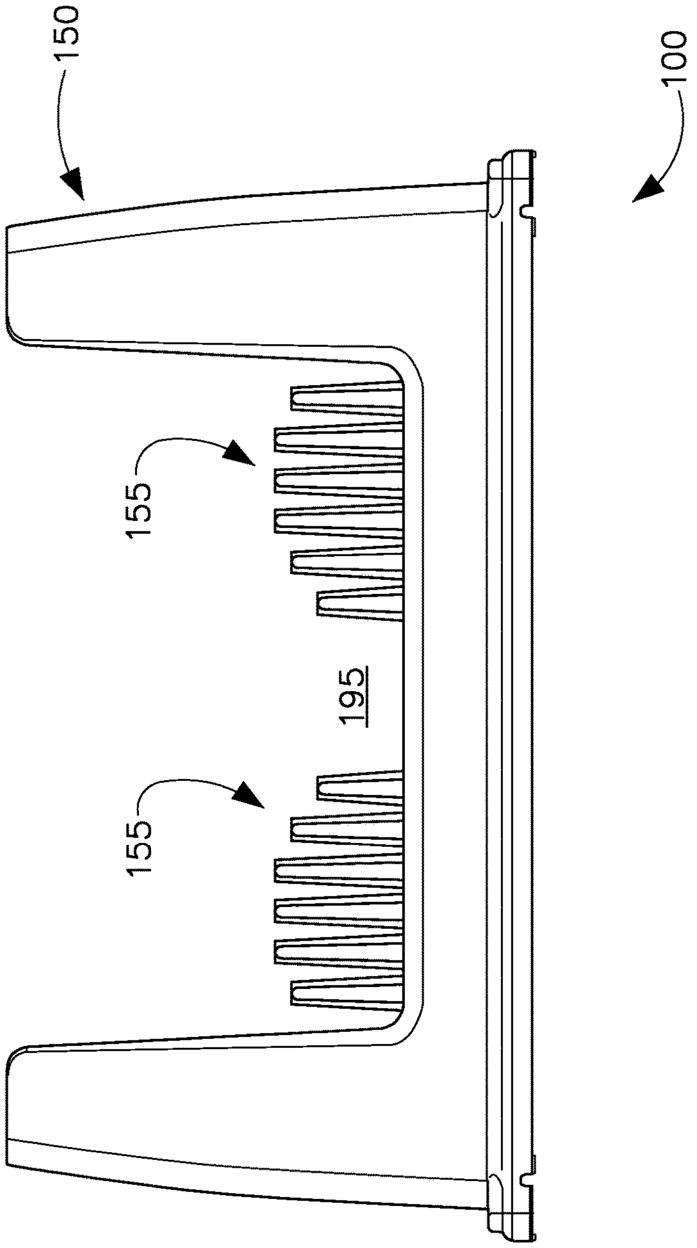

FIG. 7 (composed of FIGS. 7A and 7B) illustrates an exploded view of the lighting system 100, without the mounting hardware 105/110. In this exploded view, the driver housing 125 of the lighting system 100 is separated from the light source housing 150 of the lighting system 100.

Figure 8A:
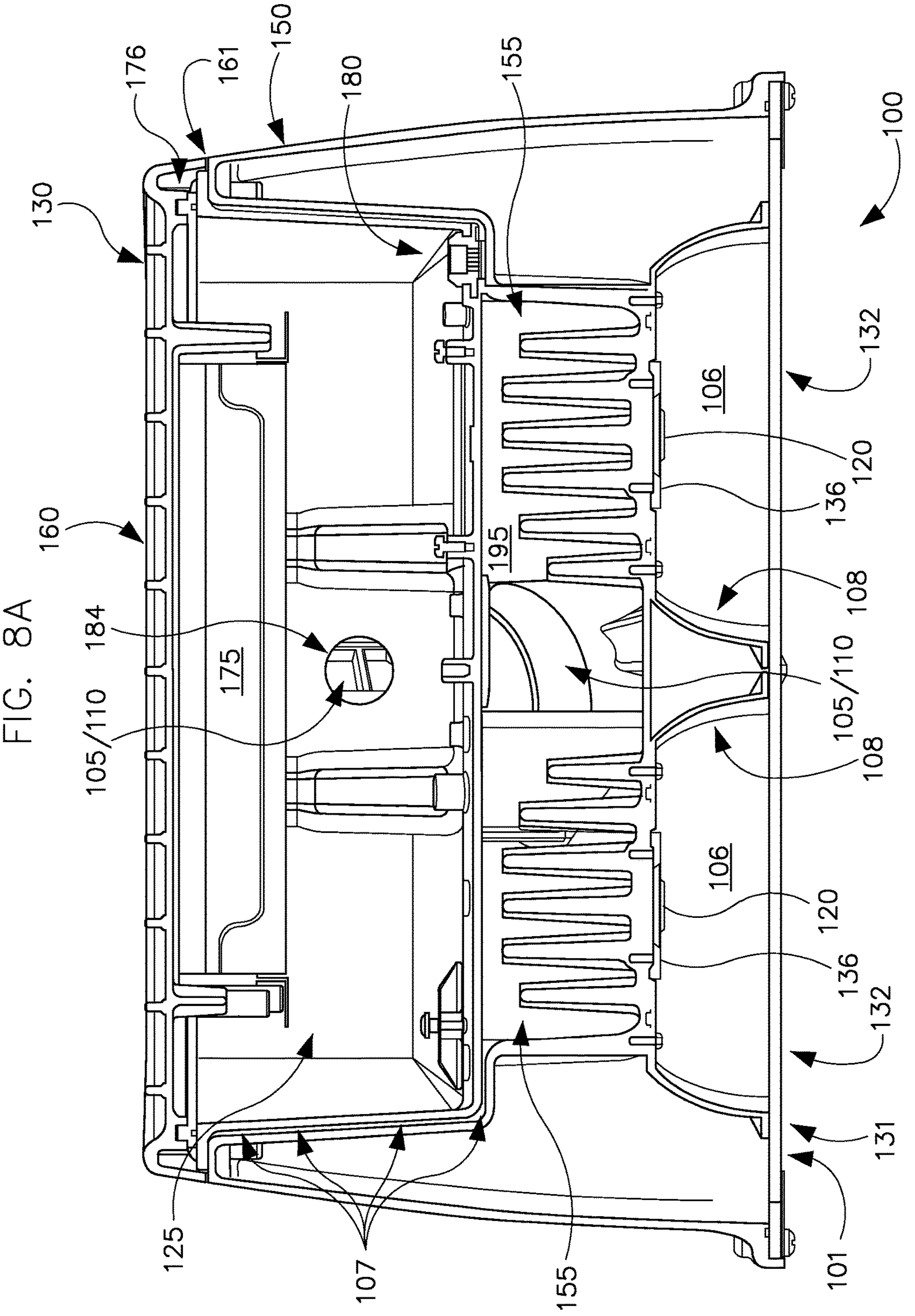
FIGS. 8A and 8B (collectively FIG. 8) illustrate cross sectional views of the lighting system according to some example embodiments of the disclosure.
Figure 8B:
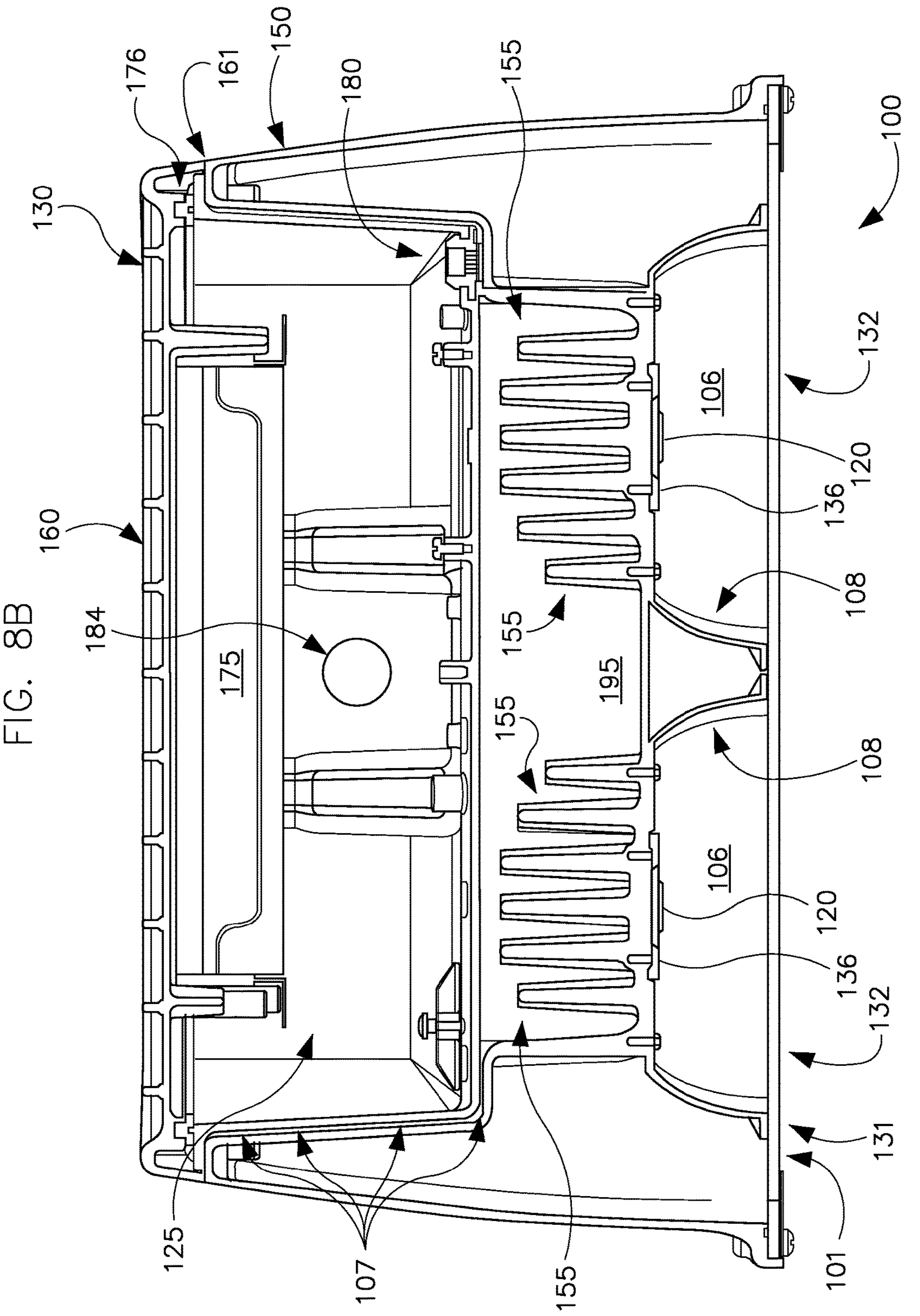

FIGS. 8A and 8B illustrate cross sectional views of the lighting system 100. In the cross sectional view of FIG. 8A, mounting hardware 105/110 of the lighting system 100 is attached. In the cross sectional view of FIG. 8B, the mounting hardware 105/110 is removed. Thus, FIGS. 8A and 8B illustrate common views, except that the mounting hardware 105/110 is present in FIG. 8A and removed in FIG. 8B.

Figure 9B:
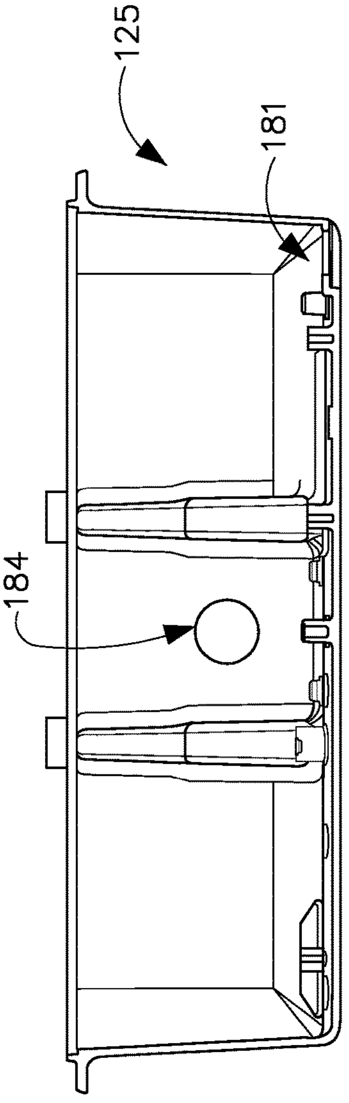
FIGS. 9A and 9B (collectively FIG. 9) illustrate an exploded cross sectional view of the lighting system, without mounting hardware, according to some example embodiments of the disclosure.
Figure 9A:
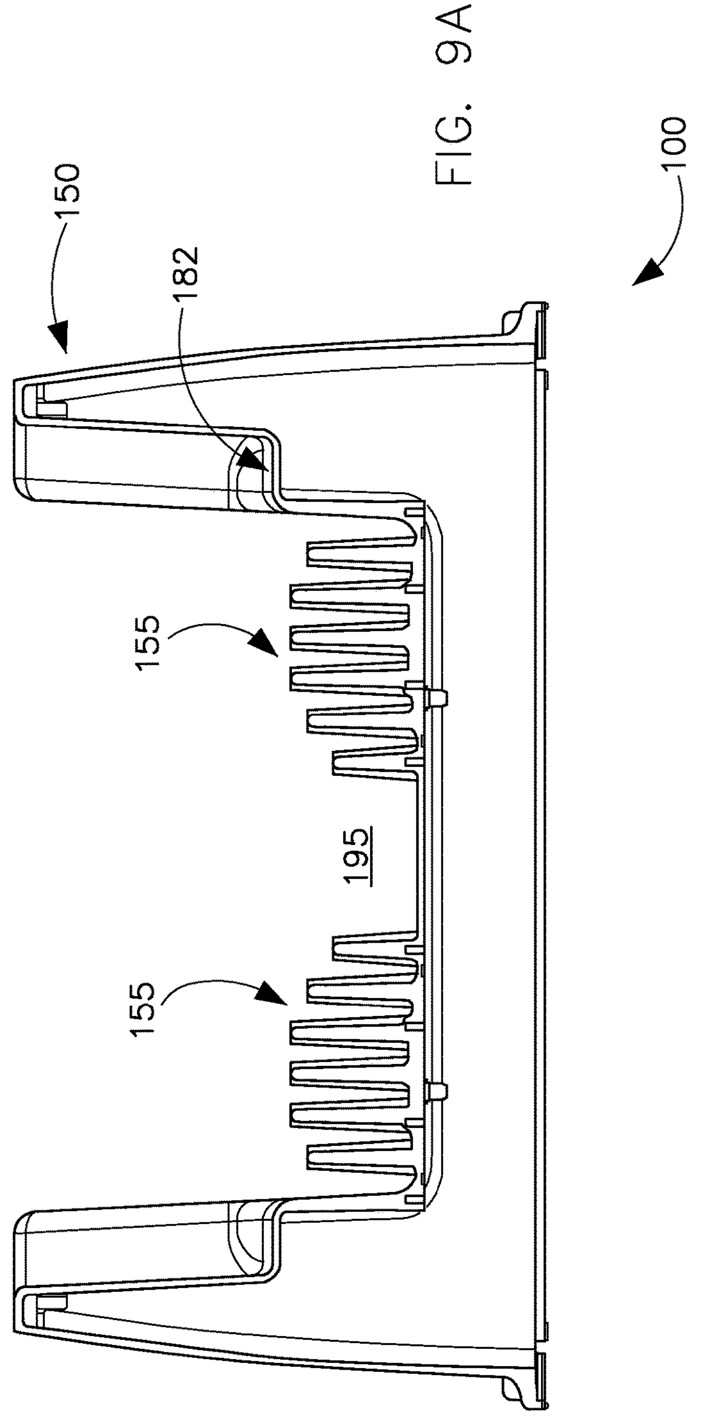

FIG. 9 (composed of FIGS. 9A and 9B) illustrates an exploded cross sectional view of the lighting system 100, without the mounting hardware 105/110. In the exploded view, the driver housing 125 of the lighting system 100 is separated from the light source housing 150 of the lighting system.

Referring now to all the figures, the lighting system 100 will be described in further detail.

In the illustrated example embodiment, the lighting system 100 comprises mounting hardware 105/110. The illustrated mounting hardware 105/110 is configured for mounting the lighting system 100 on an end of a pole. In mounting, the pole end inserts into the mounting sleeve 105, and three circumferentially disposed fasteners (see FIG. 5) screw down on the pole. In addition to the mounting sleeve 105, the mounting hardware 105/110 comprises a coupler 110 that is attached to the driver housing 125.

As can be seen in FIG. 4, the coupler 110 and the mounting sleeve 105 provide rotational adjustment to set angle of illumination relative to the pole. An installer or service technician can set the coupler 110 to direct light downward, horizontally, upward, or at various angles depending on application and preference. For example, a user may want a horizontal angle to spread light across a parking lot or large field. Meanwhile another user may want illumination to be concentrated downward, towards a particular work area.

In a typical installation, electrical supply lines (not illustrated) extend through the pole, the mounting sleeve 105, the coupler 110, and an aperture 184 in the driver housing 125.

So extended, the electrical supply lines can provide electrical line power to the light emitting diode driver 175 and, in turn, to the light emitting diodes 120.

As visible in FIG. 8, the light emitting diode driver 175 is mounted within the driver housing 125, specifically to an interior surface of the access door 130. The opposite, exterior surface of the access door 130 has heat sink fins 160 that dissipate heat. Thus, the rear exterior of the lighting system 100 comprises heat sink fins 160 for dissipating heat generated by the light emitting diode driver 175 in connection with driving the light emitting diodes 120.

A gasket 176 is located between the driver housing 125 and the access door 130. The gasket 176 helps insulate the access door 130 from heat flowing from the light emitting diodes 120. In an example embodiment, the gasket 176 separates the metal surface of the driver housing 125 from the metal surface of the light source housing 150. Accordingly, the gasket 176 can serve as a heat insulator or isolator in an example embodiment.

In operation, the light emitting diode driver 175 takes the line power and converts it to electricity of suitable form for driving the light source, which in this example comprises two chip-on-board (COB) light emitting diodes 120. One or more arrays of discrete light emitting diodes can be utilized in some embodiments as an alternative to chip-on-board light emitting diodes. The converted electricity flows through wires (not illustrated) that extend between the driver housing 125 and the light source housing 150. The wires extend out of the driver housing 125 via an aperture 181. The wires further extend into the light source housing 150 via a corresponding aperture 182. One or more gaskets 180 environmentally seal the two apertures 181, 182. See FIGS. 8 and 9 for an example embodiment.

Each light emitting diode 120 is mounted at the rear of a light cavity 106 formed by a concave reflective surface 108. As illustrated, each light emitting diode 120 has an associated mount 136 that provides mechanical attachment and electrical connection. Other embodiments can utilize other mounting technologies, for example screws, adhesives, etc.

A window 101 extends over the light emitting face of the light source housing 150 and provides environmental protection as well as light transmission. In some embodiments, the window 101 comprises a sheet of glass or silica. The window 101 has an opaque area 131 with two transparent areas 132 located in front of the light emitting diodes 120. The opaque area 131 can comprise a film created by screen-printing in black or another appropriate color in some embodiments, for example. In some embodiments, the area 131 is partially opaque or may be translucent, for example via frosting the window 101.

In the illustrated example embodiment, the light source housing 150 comprises two arrays of heat sink fins 155 opposite from the window 101. The heat sink fins 155 dissipate heat generated by the light emitting diodes 120 during operation. To shield the light emitting diode driver 175 from the heat, the heat sink fins 155 extend or project into a large air gap 195 located between the light source housing 150 and the driver housing 125.

In the illustrated embodiment, contact between the light source housing 150 and the driver housing 125 is limited to a peripheral area 161 (and may be further limited or substantially precluded by the gasket 176). The housings 125, 150 are typically cast metal, for example aluminum, but may be made of other materials having suitable mechanical and thermal properties. As illustrated in FIGS. 8 and 9, the driver housing 125 protrudes into a cavity of the light source housing 150, with an air gap 107 that extends along the sides of the cavity and separates the driver housing 125 from the light source housing 150. The air gap 107 can be viewed as an extension of the air gap 195 or vice versa. In an example embodiment, the driver housing 125 and the light source housing 150 can be viewed as nested together.

In operation, the light emitting diodes 120 produce heat. As best viewed in FIG. 8B, a portion of the light-emitting-diode-generated heat dissipates through the heat sink fins 155 disposed in the air gap 195 located between the light source housing 150 and the driver housing 125. Another portion of the light-emitting-diode-generated heat flows along the walls of the light source housing 150, along the air gap 107. That heat flows to the walls of the driver housing 125 via a thermal connection at the peripheral area 161 where the two housing 125, 150 are in physical contact. That heat then flows around the exterior corner of the access door 130 and dissipates through the heat sink fins 160. The gasket 176 helps insulate the driver 175 from that heat.

Thus, in the illustrated example embodiment, the light source housing 150 has an exterior surface that is shaped to form a cavity. Meanwhile, the driver housing 125 has an exterior surface that is shaped to extend partially into the cavity when the driver housing 125 and the light source housing 150 are aligned and positioned against one another. When the driver housing 125 and the light source housing 150 are arranged in this configuration, an air gap 107/195 between the two housings can remain open, including at the bottom of the cavity. The air gap 195 and/or the air gap 107 can promote heat dissipation. For example, the air gaps 107/195 can help route light-emitting-diode-generated heat away from the driver 175. As another example, the air gaps 107/195 can thermally insulate the driver housing 125 from the light source housing 150. As another example, the air gap 195 can provide airflow for cooling the heat sink fins 155 that extend into the air gap 195. As best shown in FIG. 6B, the air gap 195 can provide an opening that extends from the upper side of the lighting system 100 to the lower side of the lighting system 100. The heat sink fins 155 can heat the air in the air gap 195, with the heated air rising in the opening, exiting the opening, and drawing cool air into the opening from below. Thus, the air gap 195 can create a chimney effect for heat dissipation and thermal management.

Many modifications and other embodiments of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of this application. Although specific terms are employed herein, they are used in a generic and descriptive sense only and not for purposes of limitation.

What is claimed is:

1. A lighting system comprising:

a first environmentally sealed housing comprising at least one light emitting diode (LED) disposed therein;

a second environmentally sealed housing comprising an LED driver disposed therein, wherein the second environmentally sealed housing is partially disposed in a cavity defined by the first environmentally sealed housing such that a portion of an outside surface of the second environmentally sealed housing and a portion of an outside surface of the first environmentally sealed housing form an air gap therebetween; and a first set of heat sink fins projecting into the air gap from the portion of the outside surface of the first environmentally sealed housing towards the portion of the outside surface of the second environmentally sealed housing and spaced apart from the portion of the outside surface of the second environmentally sealed housing.

2. The lighting system of claim 1, wherein the first set of heat sink fins project into the air gap such that a portion of the first set of heat sink fins that is opposite to the portion of the outside surface of the first environmentally sealed housing is disposed in the air gap and spaced apart from the portion of the outside surface of the second environmentally sealed housing.

3. The lighting system of claim 1:

wherein the first environmentally sealed housing comprises a first aperture, wherein the second environmentally sealed housing comprises a second aperture, wherein the first and second apertures are axially aligned to one another when the second environmentally sealed housing is partially disposed in the cavity defined by the first environmentally sealed housing, and wherein the first and second apertures that are axially aligned are environmentally sealed by a gasket disposed therein and are sized to pass an electrical feed for transmitting electricity between the LED driver and the at least one LED.

4. The lighting system of claim 1, further comprising:

an access door that is coupled to and configured to enclose the second environmentally sealed housing, wherein the access door comprises a first surface and a second surface, and wherein the LED driver is coupled to the first surface of the access door.

5. The lighting system of claim 1, wherein the second surface of the access door comprises a second set of heat sink fins that are configured to dissipate heat generated by the LED driver.

6. The lighting system of claim 4, further comprising:

a gasket disposed in between the access door and the second environmentally sealed housing such that the gasket thermally insulates the access door from heat that is generated by the at least one LED and transferred from the first environmentally sealed housing that houses the at least one LED to the second environmentally sealed housing through another portion of the second environmentally sealed housing that is in thermal contact with the first environmentally sealed housing.

7. The lighting system of claim 1, wherein the at least one light emitting diode comprises a plurality of chip-on-board light emitting diodes, and wherein the air gap is uninterrupted at a bottom of the cavity.

8. The lighting system of claim 1, further comprising mounting hardware configured for attaching to an end of a pole.

9. The lighting system of claim 1, further comprising:

a window that is coupled to the first environmentally sealed housing and configured to enclose the first environmentally sealed housing, wherein the window comprises a sheet of glass, wherein the window comprises a first window area and a second window area that are surrounded by a third window area, and wherein the first window area and the second window area have substantially higher light transmission than the third window area.

10. The lighting system of claim 9:

wherein one LED of the at least one LED is disposed behind the first window area, and wherein a second LED of the at least one LED is disposed behind the second window area.

11. The lighting system of claim 1, wherein the air gap extends, without interruption, from an upper side of the lighting system to a lower side of the lighting system.

12. A lighting system comprising:

a first environmentally sealed housing comprising at least one light source disposed therein;

a second environmentally sealed housing comprising a driver associated with the at least one light source disposed therein, wherein the second housing is nested in a cavity defined by the first housing to form an uninterrupted environmentally exposed air gap between the first environmentally sealed housing and the second environmentally sealed housing;

a first set of heat sink fins projecting into the uninterrupted environmentally exposed air gap from an outside surface of the first environmentally sealed housing toward an outside surface of the second environmentally sealed housing and spaced apart from the outside surface of the second environmentally sealed housing;

an access door that is coupled to the second environmentally sealed housing and comprising a first surface and an opposite second surface, wherein the access door is coupled to the second environmentally sealed housing such that the first surface encloses the second environmentally sealed housing and the opposite second surface is environmentally exposed, wherein the opposite second surface comprises a second set of heat sink fins disposed thereon to dissipate heat generated by the driver, and wherein the driver is attached to the first surface; and a gasket disposed in between the access door and the second environmentally sealed housing such that the gasket thermally insulates the access door from heat generated by the at least one light source and transferred from the first environmentally sealed housing comprising the at least one light source to the second environmentally sealed housing through a portion of the second environmentally sealed housing that is in thermal contact with the first environmentally sealed housing.

13. The lighting system of claim 12:

wherein the first environmentally sealed housing comprises a first aperture, wherein the second environmentally sealed housing comprises a second aperture, wherein the first and second apertures are axially aligned to one another when the portion of the second environmentally sealed housing is nested in the cavity defined by the first environmentally sealed housing, and wherein the first and second apertures that are axially aligned are environmentally sealed by another gasket disposed therein and are sized to pass an electrical feed for transmitting electricity between the LED driver and the at least one LED.

14. The lighting system of claim 12, wherein the at least one light source comprises a plurality of chip-on-board light emitting diodes.

15. The lighting system of claim 12, wherein the uninterrupted environmentally exposed air gap is uninterrupted at a bottom of the cavity.

16. The lighting system of claim 12, wherein the thermal contact between the first environmentally sealed housing and the second environmentally sealed housing is limited to a peripheral area of the first environmentally sealed housing and the second environmentally sealed housing.

17. The lighting system of claim 12, further comprising mounting hardware configured for attaching to an end of a pole.

18. The lighting system of claim 17, wherein the mounting hardware comprises:

a mounting sleeve that is configured to receive the end of the pole therein, the pole being secured to the mounting sleeve using fasteners, and a coupler that is coupled to the mounting sleeve on one side and attached to the second environmentally sealed housing on an opposite side, wherein the coupler is configured to provide rotational adjustment of the lighting system to set an angle of illumination relative to the pole.

19. The lighting system of claim 12, wherein the uninterrupted environmentally exposed air gap comprises an opening that extends from an upper side of the lighting system to a lower side of the lighting system.

* * * * *